United States Patent
Mow et al.

(10) Patent No.: US 8,245,097 B2
(45) Date of Patent: Aug. 14, 2012

(54) ITERATIVE DECODING OF PUNCTURED LOW-DENSITY PARITY CHECK CODES BY SELECTION OF DECODING MATRICES

(75) Inventors: Wai Ho Mow, Hong Kong (CN); Xiaoxiao Wu, Hong Kong (CN)

(73) Assignee: Kan Ling Capital, L.L.C., Wilmington, DE (US)

( * ) Notice: Subject to any disclaimer, the term of this patent is extended or adjusted under 35 U.S.C. 154(b) by 770 days.

(21) Appl. No.: 12/430,604

(22) Filed: Apr. 27, 2009

(65) Prior Publication Data

US 2010/0275089 A1   Oct. 28, 2010

(51) Int. Cl.
  *G06F 11/00* (2006.01)
(52) U.S. Cl. .................. 714/752; 714/790
(58) Field of Classification Search .............. 714/752, 714/790, 755, 791, 800, 805
  See application file for complete search history.

(56) References Cited

U.S. PATENT DOCUMENTS

| | | | |
|---|---|---|---|
| 7,954,033 B2 * | 5/2011 | Hong et al. ............... | 714/755 |
| 8,060,796 B2 * | 11/2011 | Wang et al. ............... | 714/704 |
| 2007/0022362 A1 * | 1/2007 | Yue et al. ............... | 714/790 |
| 2008/0301518 A1 * | 12/2008 | Miyazaki ............... | 714/752 |
| 2009/0016352 A1 * | 1/2009 | Wang et al. ............... | 370/394 |
| 2010/0122140 A1 * | 5/2010 | Shen et al. ............... | 714/752 |

OTHER PUBLICATIONS

R. G. Gallager, "Low-density parity-check codes," IRE Trans. Inform. Theory, vol. pp. 21-28, Jan. 1962.
D.J.C.MacKay. "Good error-correcting codes based on very sparse matrices," IEEE Trans. Inform. Theory, vol. 45, pp. 399-431, Mar. 1999.
S. Y. Chung, T. J. Richardson, and R. L. Urbanke, "Analysis of sumproduct decoding of low-density parity-check codes using a Gaussian approximation," IEEE Trans. Inform. Theory, pp. 657-670, Feb. 2001.
R. M. Tanner, "A recursive approach to low complexity codes," IEEE Trans. Inf. Theory, vol. IT-27, No. 6, pp. 533-547, Sep. 1981.
N.Wiberg, H.-A. Loeliger, and R. Kotler, "Codes and iterative decoding on general graphs," Europ. Trans. Telecommun., vol. 6, pp. 513-526, Sep. 1995.

* cited by examiner

*Primary Examiner* — Dieu-Minh Le
(74) *Attorney, Agent, or Firm* — Turocy & Watson, LLP

(57) ABSTRACT

Methods and apparatus for enabling effective decoding of rate-compatible punctured codes are presented herein. A puncturing component can derive one or more partial puncturing patterns and corresponding decoding matrices/graphs that represent punctured code from a parity check matrix/graph of a mother code and a puncturing pattern specified for the mother code. Further, a rowcombining component can combine rows of the parity check matrix/graph based on the derived one or more partial puncture patterns. Further, the rowcombining component can create at least one decoding matrix/graph to represent the punctured code based on the combined rows. In addition, a selection component can select a decoding matrix/graph from the created at least one decoding matrix/graph that does not contain a girth-4 cycle.

25 Claims, 15 Drawing Sheets

LDPC CODE GRAPH 210

$$H = \begin{array}{c} \\ e_1 \\ e_2 \\ e_3 \\ e_4 \\ e_5 \\ e_6 \\ e_7 \\ e_8 \\ e_9 \end{array} \begin{array}{c} b_1\ b_2\ b_3\ b_4\ b_5\ b_6\ b_7\ b_8\ b_9\ b_{10}\ b_{11}\ b_{12} \\ \begin{pmatrix} 1 & 0 & 1 & 1 & 0 & 1 & 1 & 0 & 1 & 1 & 0 & 1 \\ 0 & 1 & 0 & 0 & 1 & 0 & 0 & 1 & 0 & 0 & 1 & 1 \\ 1 & 0 & 0 & 1 & 0 & 0 & 1 & 0 & 0 & 1 & 0 & 0 \\ 0 & 0 & 1 & 0 & 0 & 0 & 0 & 0 & 1 & 0 & 0 & 1 \\ 0 & 1 & 0 & 0 & 1 & 1 & 0 & 1 & 0 & 0 & 1 & 0 \\ 1 & 0 & 0 & 1 & 0 & 0 & 1 & 0 & 0 & 1 & 0 & 1 \\ 0 & 0 & 1 & 0 & 0 & 0 & 0 & 0 & 1 & 0 & 0 & 1 \\ 0 & 1 & 0 & 0 & 1 & 0 & 0 & 1 & 0 & 0 & 1 & 0 \\ 1 & 0 & 0 & 1 & 0 & 1 & 1 & 0 & 0 & 1 & 0 & 0 \end{pmatrix} \end{array}$$

$\rightarrow \begin{array}{c} \\ e_1 \\ e_2 \\ e_3 \\ e_4 \\ e_5 \\ e_6 \\ e_7 \\ e_8 \\ e_9 \end{array} \begin{array}{c} b_1\ b_2\ b_3\ b_4\ b_5\ \otimes\ b_7\ b_8\ b_9\ b_{10}\ b_{11}\ b_{12} \\ \begin{pmatrix} 0 & 0 & 0 & 0 & 0 & 0 & 0 & 0 & 0 & 0 & 0 \\ 0 & 1 & 0 & 0 & 1 & 0 & 0 & 1 & 0 & 0 & 1 \\ 1 & 0 & 0 & 1 & 0 & 0 & 1 & 0 & 0 & 1 & 0 \\ 0 & 0 & 1 & 0 & 0 & 0 & 0 & 0 & 1 & 0 & 0 & 1 \\ 1 & 1 & 1 & 1 & 0 & 1 & 1 & 1 & 1 & 1 & 1 \\ 1 & 0 & 0 & 1 & 0 & 0 & 1 & 0 & 0 & 1 & 0 & 1 \\ 0 & 0 & 1 & 0 & 0 & 0 & 0 & 0 & 1 & 0 & 0 & 1 \\ 0 & 1 & 0 & 0 & 1 & 0 & 0 & 1 & 0 & 0 & 1 & 0 \\ 0 & 0 & 1 & 0 & 0 & 0 & 0 & 1 & 0 & 0 & 1 \end{pmatrix} \end{array}$ $\rightarrow \underbrace{101101101101}_{e_1} + \underbrace{101101101101}_{e_1}$ $\rightarrow \underbrace{101101101101}_{e_1} + \underbrace{010011010010}_{e_5}$ $\rightarrow \underbrace{101101101101}_{e_1} + \underbrace{100101100100}_{e_9}$

EQUIVALENT CODE MATRIX 220

FIG. 2

SYSTEM 300

PUNCTURING COMPONENT 110

ROWCOMBINING COMPONENT 120

SELECTION COMPONENT 130

PATTERN COMPONENT 310

FIG. 3

ITERATIVE DECODING OF PUNCTURED LOW-DENSITY PARITY CHECK CODES BY SELECTION OF DECODING MATRICES

TECHNICAL FIELD

This disclosure relates generally to data communication, and in particular, but not exclusively, relates to methods and apparatus for implementing rate-compatible punctured coding using Low-density Parity-check (LDPC) codes.

BACKGROUND

Low-density Parity-check (LDPC) code is a type of error correcting code used to transmit messages over noisy transmission channels. Many communication systems and standards employ LDPC coding to ensure reliable communications (e.g., satellite systems, digital video broadcasting (DVB-S2), 3GPP2, wireless local area networks (IEEE 802.11), broadband wireless access/WiMax (IEEE 802.16), mobile broadband wireless access (IEEE 802.20), etc.).

To account for transmission errors, conventional techniques add redundant bits (e.g. parity bits) to a bit stream of an encoded message when the bit stream is transmitted. For example, a receiver can reduce a bit error rate (BER) of an LDPC encoded message by utilizing parity bits. Other techniques can incrementally remove parity bits from a bit stream by puncturing (or deleting) the parity bits according to a puncture pattern. When errors are detected by a receiver, a transmitter can send punctured parity bits to the receiver and the receiver can use the parity bits to reduce bit errors.

LDPC punctured code includes a series of rate-compatible punctured codes that can be obtained by successively puncturing a mother (or original) LDPC code—high-rate (e.g., punctured) codes are embedded into lower-rate codes derived from the mother LDPC code. If higher rate codes are not sufficient to decode channel (e.g., transmission) errors, punctured bits can be transmitted to improve an associated BER. For example, rate-compatible punctured codes are widely used in combination with retransmission schemes (e.g., a hybrid automatic repeat request (H-ARQ) retransmission scheme), in which punctured bits are incrementally transmitted when errors are detected in a received data packet. A mother code and a series of rate-compatible puncturing patterns are sufficient to accommodate different effective code rates associated with, e.g., an H-ARQ retransmission scheme. Under such a scheme, a received data packet can be decoded using an iterative decoder tailored to the mother code—the decoder uses a graph/matrix of the mother code to decode rate-compatible punctured codes by treating punctured bits on the graph/matrix of the mother code as erased bits. However, such conventional rate-compatible decoding techniques result in increased decoding complexity and latency.

Therefore, there is a need to provide methods and apparatus to effectively decode rate-compatible punctured LDPC codes.

SUMMARY

The following presents a simplified summary of the innovation to provide a basic understanding of some aspects described herein. This summary is not an extensive overview of the disclosed subject matter. It is not intended to identify key or critical elements of the disclosed subject matter or delineate the scope of the subject innovation. Its sole purpose is to present some concepts of the disclosed subject matter in a simplified form as a prelude to the more detailed description that is presented later.

The claimed subject matter relates to methods and apparatus for effectively decoding rate-compatible punctured Low-density Parity-check (LDPC) codes. Conventional rate-compatible LDPC decoding technology wastes valuable computing resources and indeterministically decodes successive rate-compatible LDPC codes by using a mother code matrix/graph to decode punctured LDPC code.

Compared to conventional rate-compatible LDPC decoding techniques, the novel methods and apparatus of the claimed subject matter improve LDPC decoding performance by deriving, from a mother code matrix/graph, a decoding matrix/graph that can be used to decode rate-compatible LDPC code.

According to one aspect of the disclosed subject matter, a puncturing component can derive one or more puncture subsets of a puncturing pattern of a target rate of a mother code for a parity check matrix/graph of the mother code. A row-combining component can combine rows of the parity check matrix/graph as a function of the derived puncture subset(s). In addition, the rowcombining component can create different decoding matrices/graphs to represent punctured code based on the combined rows. Further, a selection component can select a decoding matrix/graph from the created decoding matrices/graphs that does not contain a girth-4 cycle. In this way, the novel methods and apparatus of the subject invention enable efficient decoding of punctured LDPC code.

In one aspect of the disclosed subject matter, the rowcombining component can combine rows of the parity check matrix/graph of the mother code by puncturing (or removing) a bit from at least one parity check equation. The bit can be punctured by subtracting (or modulo-2 adding) one parity check matrix/graph with itself and other parity check equations associated with the bit. By removing the bit and one associated parity check equation from the parity check matrix/graph, a decoding matrix/graph can be selected to enable effective decoding of rate-compatible punctured code.

According to another aspect of the disclosed subject matter, a graph component can derive a girth-4-free graph that corresponds to the punctured code based on the selected decoding matrix/graph and corresponding derived partial puncture pattern(s) of the puncture pattern. The girth-4-free graph (i.e., graph that does not include girth 4 cycles) can be used to decode the punctured code. In yet another aspect of the subject invention, a decode component can use the selected decoding matrix/graph to iteratively decode the punctured code more efficiently than conventional rate-compatible decoding techniques since bits punctured according to the novel methods and apparatus of the claimed subject matter do not have to be recovered during the decoding process.

The following description and the annexed drawings set forth in detail certain illustrative aspects of the disclosed subject matter. These aspects are indicative, however, of but a few of the various ways in which the principles of the innovation may be employed. The disclosed subject matter is intended to include all such aspects and their equivalents. Other advantages and distinctive features of the disclosed subject matter will become apparent from the following detailed description of the innovation when considered in conjunction with the drawings.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIG. 2 illustrates an LDPC code graph and equivalent code matrix, in accordance with an embodiment of the invention.

FIG. 3 illustrates a demonstrative system that includes a pattern component for creating a modified puncturing pattern for decoding rate-compatible punctured LDPC code based on an equivalent decoding matrix/graph, in accordance with an embodiment of the invention.

DETAILED DESCRIPTION

Figure 1:
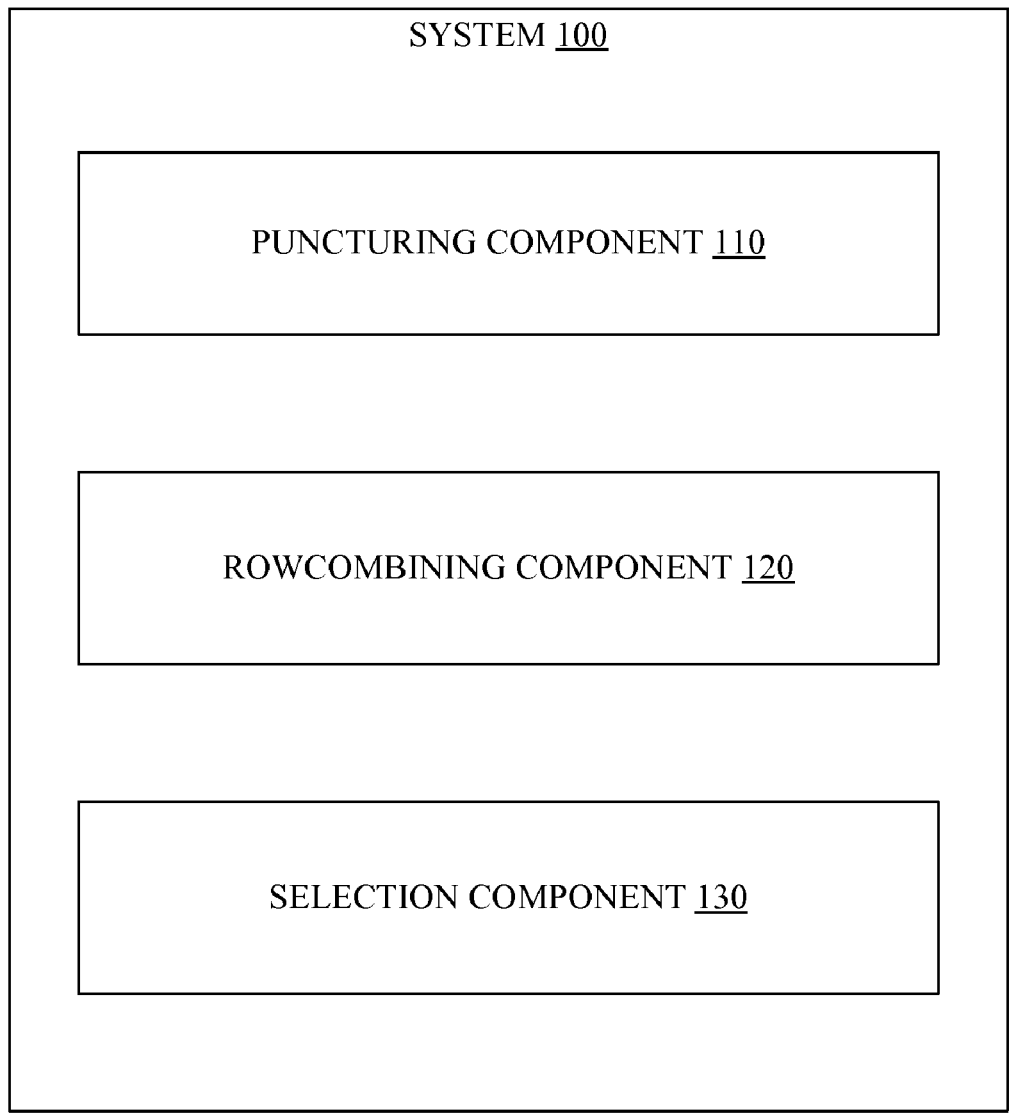
FIG. 1 illustrates a demonstrative system for determining a matrix/graph representation of a rate-compatible punctured Low-density Parity-check (LDPC) code, in accordance with an embodiment of the invention.

Embodiments of methods and apparatus for enabling efficient decode of rate-compatible punctured Low-density Parity-check (LDPC) codes are described herein.

In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrase "in one embodiment" or "in an embodiment" in various places throughout this specification are not necessarily all referring to the same embodiment. Furthermore, the particular features, structures, or characteristics may be combined in any suitable manner in one or more embodiments.

As utilized herein, terms "component," "system," "interface," and the like are intended to refer to a computer-related entity, hardware, software (e.g., in execution), and/or firmware. For example, a component can be a process running on a processor, a processor, an object, an executable, a program, and/or a computer. By way of illustration, an application running on a server and the server can be a component. One or more components can reside within a process and a component can be localized on one computer and/or distributed between two or more computers.

The word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

Artificial intelligence based systems (e.g., explicitly and/or implicitly trained classifiers) can be employed in connection with performing inference and/or probabilistic determinations and/or statistical-based determinations as in accordance with one or more aspects of the disclosed subject matter as described herein. For example, in one embodiment, an artificial intelligence system can be used utilized in accordance with process 700 described below to automatically determine a matrix/graph representation of a rate-compatible punctured LDPC code, and/or in accordance with decoder 1300 to automatically obtain an efficient decoding representation of the rate-compatible punctured LDPC code by utilizing an equivalent decoding matrix/graph without girth 4 cycles. One or more components (e.g., hardware devices and/or software processes) can be utilized by an artificial intelligence system to perform the methods and apparatus disclosed herein.

As used herein, the term "infer" or "inference" refers generally to the process of reasoning about or inferring states of the system, environment, user, and/or intent from a set of observations as captured via events and/or data. Captured data and events can include user data, device data, environment data, data from sensors, sensor data, application data, implicit data, explicit data, etc. Inference can be employed to identify a specific context or action, or can generate a probability distribution over states of interest based on a consideration of data and events, for example.

Inference can also refer to techniques employed for composing higher-level events from a set of events and/or data.

Such inference results in the construction of new events or actions from a set of observed events and/or stored event data, whether the events are correlated in close temporal proximity, and whether the events and data come from one or several event and data sources. Various classification schemes and/or systems (e.g., support vector machines, neural networks, expert systems, Bayesian belief networks, fuzzy logic, and data fusion engines) can be employed in connection with performing automatic and/or inferred action in connection with the disclosed subject matter.

In addition, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, computer-readable carrier, or computer-readable media. For example, computer-readable media can include, but are not limited to, magnetic storage devices (e.g., hard disk, floppy disk, magnetic strips), optical disks (e.g., CD, DVD), smart cards, and flash memory devices (e.g., card, stick, key drive).

The subject invention provides methods and apparatus for enabling efficient decoding of rate-compatible punctured Low-density Parity-check (LDPC) codes. By finding an equivalent decoding matrix/graph of a rate-compatible punctured LDPC code, the novel methods and apparatus of the subject invention reduce iterative decoder complexity and communication system latency.

FIG. 1 illustrates a demonstrative system 100 for determining a matrix/graph representation of a rate-compatible punctured Low-density Parity-check (LDPC) code, in accordance with an embodiment of the invention. System 100 and the systems and processes explained below may constitute machine-executable instructions embodied within a machine (e.g., computer) readable medium, which when executed by a machine will cause the machine to perform the operations described. Additionally, the systems and processes may be embodied within hardware, such as an application specific integrated circuit (ASIC) or the like. The order in which some or all of the process blocks appear in each process should not be deemed limiting. Rather, it should be understood by a person of ordinary skill in the art having the benefit of the instant disclosure that some of the process blocks may be executed in a variety of orders not illustrated.

The following discussion references a punctured LDPC code graph 210 and an equivalent code matrix 220 (illustrated by FIG. 2) to provide context for aspects of an exemplary operation of system 100. As described above, rate-compatible punctured codes can be obtained by conventional technology through successive puncture of a mother code (or original code), which embeds high-rate codes into lower-rate codes derived from the mother code. A data packet associated with the mother code can be decoded using a decoder tailored to the mother code since the decoder only requires a puncture pattern corresponding to one of the high-rate codes. However, conventional rate-compatible LDPC decoding techniques result in reduced decoding performance and increased power consumption because such techniques use the mother code matrix/graph to decode rate-compatible LDPC code.

In contrast, system 100 determines a matrix/graph representation (e.g., equivalent code matrix 220) of a rate-compatible punctured Low-density Parity-check (LDPC) code to enable efficient decoding of rate-compatible punctured LDPC codes. As illustrated by FIG. 1, system 100 can include a puncturing component 110, a rowcombining component 120, and a selection component 130. Puncturing component 110 can derive a number of partial puncturing patterns of a puncturing pattern related to a target rate of a mother code. As described below, the partial puncturing patterns can be used by rowcombining component 120 to create corresponding modified code matrices/graphs (or equivalent decoding matrices/graphs) that can provide equivalent representations of targeted punctured code specified by a puncturing pattern and parity check matrix/graph of the mother code (e.g., LDPC code graph 210 illustrated by FIG. 2). LDPC code graph 210 is a 9×12 mother code matrix/graph that depicts 9 rows associated with 12 bits. Each row is associated with a parity check equation (or codeword) (e.g., $e_1$-$e_9$), and each codeword is associated with 12 bits (e.g., $b_1$-$b_{12}$) related to variable nodes of a mother code.

LDPC code graph 210 includes three types of nodes (not described in FIG. 2): (1) information nodes that represent information bits to be recovered from an associated codeword; (2) un-punctured parity nodes associated with parity bits; and (3) punctured parity nodes. By eliminating punctured parity nodes in LDPC code graph 210, system 100 can create a parity check matrix (e.g., equivalent code matrix 220) that represents rate-compatible punctured LDPC code. Unlike conventional techniques, equivalent code matrix 220 can be used in place of a parity check matrix/graph of a mother code (e.g., LDPC code graph 210) to decode the rate-compatible punctured LDPC code—reducing decode complexity and increasing decode performance.

Each bit puncture in a codeword is equivalent to eliminating a variable node from an associated mother code graph. A punctured node of degree k corresponds to an intermediate punctured parity (or dummy) variable involved in calculating checksums associated with k parity check equations. Such a node is also called an invisible node. The dummy variable can be eliminated by combining the k parity check equations into (k−1) parity check equations. To this end, rowcombining component 120 can combine rows of a parity check matrix/graph of a mother code (e.g., LDPC code graph 210) as a function of the partial puncturing patterns derived by puncturing component 110. Further, rowcombining component 120 can create at least one equivalent decoding matrix/graph (e.g., equivalent code matrix 220) to represent rate-compatible punctured LDPC code, based on the combined rows of the parity check matrix/graph of the mother code.

As illustrated by FIG. 2, rowcombining component 120 can puncture bit 6 ($b_6$) from LDPC code graph 210 by eliminating bit 6 from all parity check equations implicating bit 6. Bit 6 has a degree of 3 and is involved in check equations $e_1$, $e_5$, and $e_9$. To puncture bit 6, rowcombining component can subtract (or modulo-2 add) equation $e_1$ from (or to) equations $e_1$, $e_5$, and $e_9$, respectively. As a result of this "rowcombining" operation, punctured bit 6 and check equation $e_1$ are removed from equivalent code matrix 220. Further, selection component 130 can select a decoding matrix/graph from the at least one decoding matrix/graph created by rowcombining component 120, which can be used in place of LDPC code graph 210 to decode rate-compatible LDPC code. In one example, selection component can select a decoding matrix/graph that does not contain a girth-4 cycle.

In another embodiment (not shown), system 100 can create a decoding matrix/graph to represent a rate-compatible punctured block-type LDPC (B-LDPC) code. For example, puncturing component 110 can derive a number of partial puncturing patterns for each block size z of a B-LDPC mother code matrix/graph, and rowcombining component 120 can combine rows of the B-LDPC mother code matrix/graph based on the derived partial puncturing patterns. In addition, rowcombining component 120 can create a decoding matrix/graph for the rate-compatible punctured B-LDPC code. Further, selection component 130 can select an equivalent decoding matrix/graph that can be used in place of the B-LDPC mother code matrix/graph to decode the rate-compatible punctured B-LDPC code for each block size. In this way, system 100 can facilitate faster decoding convergence and lower computational complexity compared to conventional technology that uses a mother code matrix/graph to iteratively decode rate-compatible punctured B-LDPC code because punctured (removed) blocks of bits do not have to be recovered by a decoder.

In one embodiment, selection component 130 can select a girth-4-free decoding matrix/graph (i.e., a matrix/graph free of girth 4 levels) for each block size z to represent rate-compatible punctured B-LDPC code. The girth of a graph is defined as a length of the shortest loop (or cycle) present in a mother codes' equivalent Tanner graph. A Tanner graph is a visual representation of a parity check matrix (H) of a mother code, and can include (1) a variable node for each codeword bit; and (2) a check node for each parity-check equation represented by the parity check matrix H. By selecting a girth-4-free decoding matrix/graph representative of the rate-compatible punctured B-LDPC code, decoding performance can be further enhanced.

Now referring to FIG. 3, a demonstrative system 300 that includes a pattern component 310 for creating a modified puncturing pattern for decoding the rate-compatible punctured LDPC code based on an equivalent decoding matrix/graph is illustrated, in accordance with an embodiment of the invention. Pattern component 310 can create the modified puncturing pattern based on the partial puncturing patterns derived by puncture component 110. As described below (see e.g., FIG. 7, FIG. 13), the modified puncturing pattern created by pattern component 310 can be used for decoding the rate-compatible LDPC code based on the decoding matrix selected by component 130.

Figure 4:
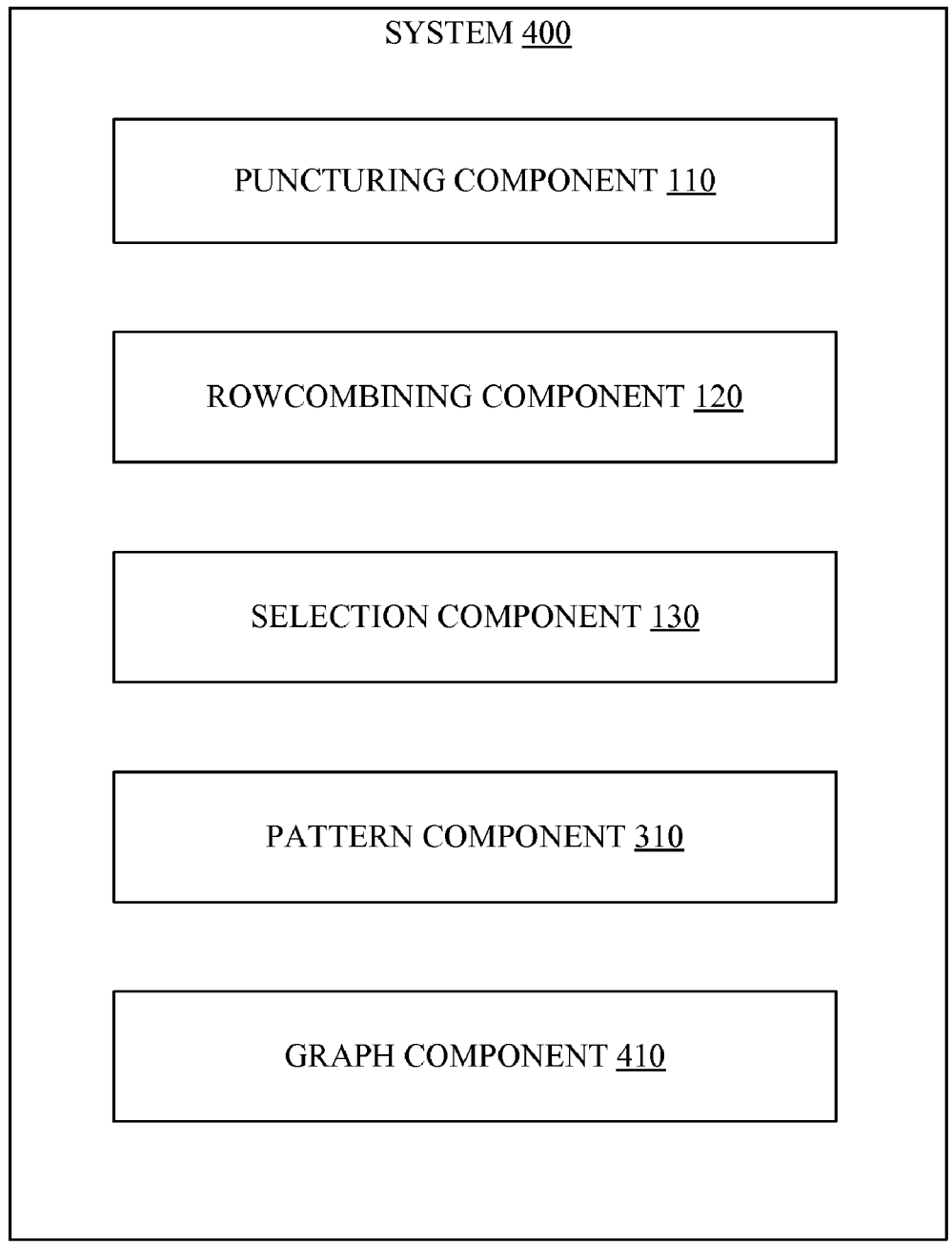
FIG. 4 illustrates a demonstrative system that includes a graph component for deriving a girth-4-free graph that represents a rate-compatible punctured LDPC code, in accordance with an embodiment of the invention.
Figure 5:
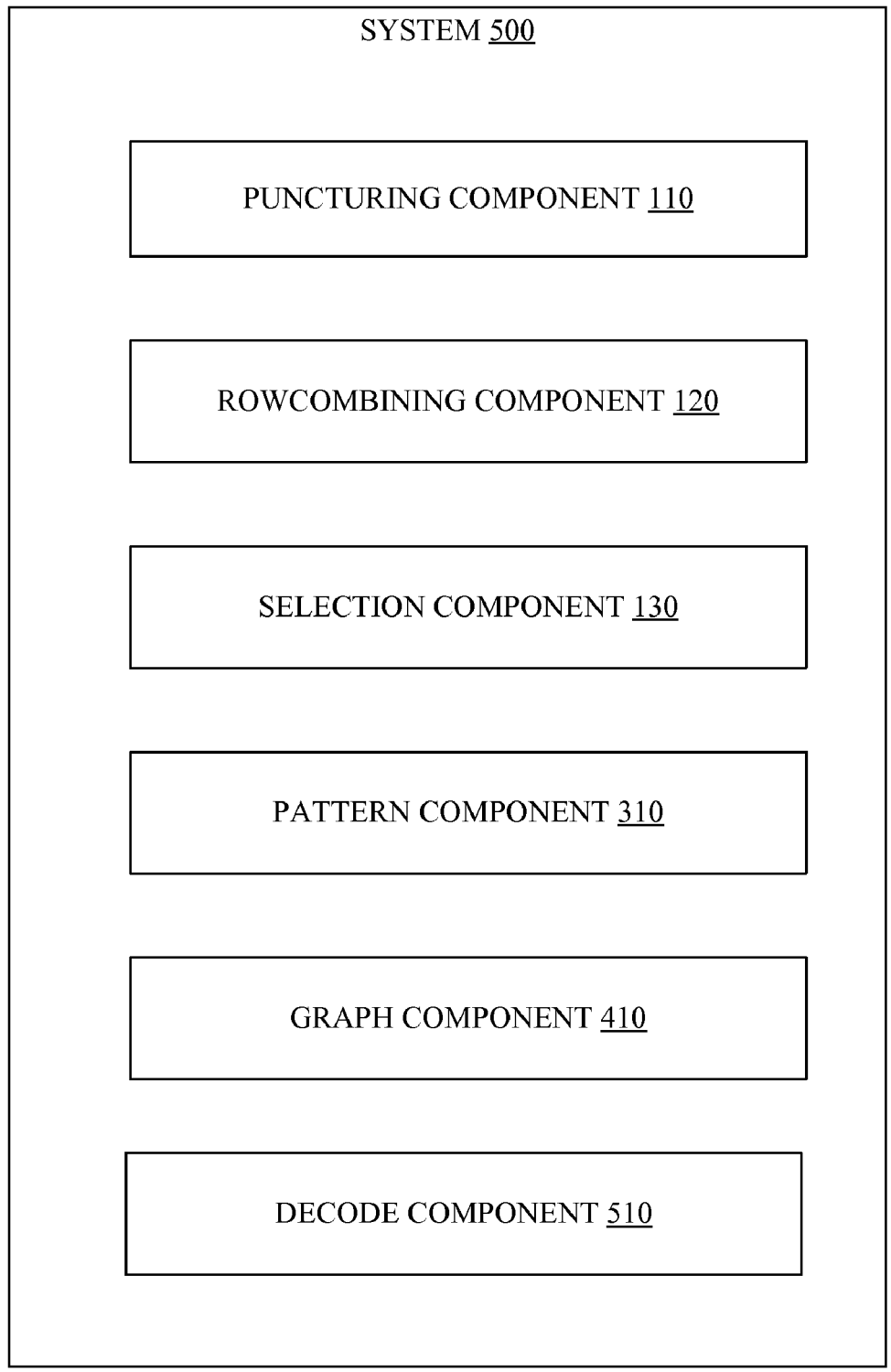
FIG. 5 illustrates a demonstrative system that includes a decode component for decoding the rate-compatible punctured LDPC code based on a girth-4-free decoding matrix/graph, in accordance with an embodiment of the invention.

FIGS. 4 and 5 illustrate, respectively, a demonstrative system 400 that includes a graph component 410 for deriving a girth-4-free decoding matrix/graph that represents a rate-compatible punctured LDPC code, and a demonstrative system 500 that includes a decode component 510 for decoding the rate-compatible punctured LDPC code based on the girth-4-free decoding matrix/graph, in accordance with an embodiment of the invention.

Graph component 410 can derive the girth-4-free decoding matrix/graph based on (1) a decoding matrix/graph (e.g., equivalent code matrix 220) selected by component 130 of system 100 and (2) a modified puncturing pattern created by pattern component 310. Correspondingly, decode component 510 can decode the rate-compatible punctured LDPC code associated with the girth-4-free decoding matrix/graph by using the modified puncturing pattern. In one embodiment, the modified puncturing pattern can be determined by pattern component 310 based on the difference between a puncturing pattern related to a target rate of a mother code and selected partial puncturing patterns derived by puncturing component 110—resulting in a decoding matrix/graph without girth-4 cycles.

FIGS. 6-9 and 11 illustrate methodologies in accordance with the disclosed subject matter. For simplicity of explanation, the methodologies are depicted and described as a series of acts. It is to be understood and appreciated that the subject innovation is not limited by the acts illustrated and/or by the order of acts. For example, acts can occur in various orders and/or concurrently, and with other acts not presented or described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Figure 6:
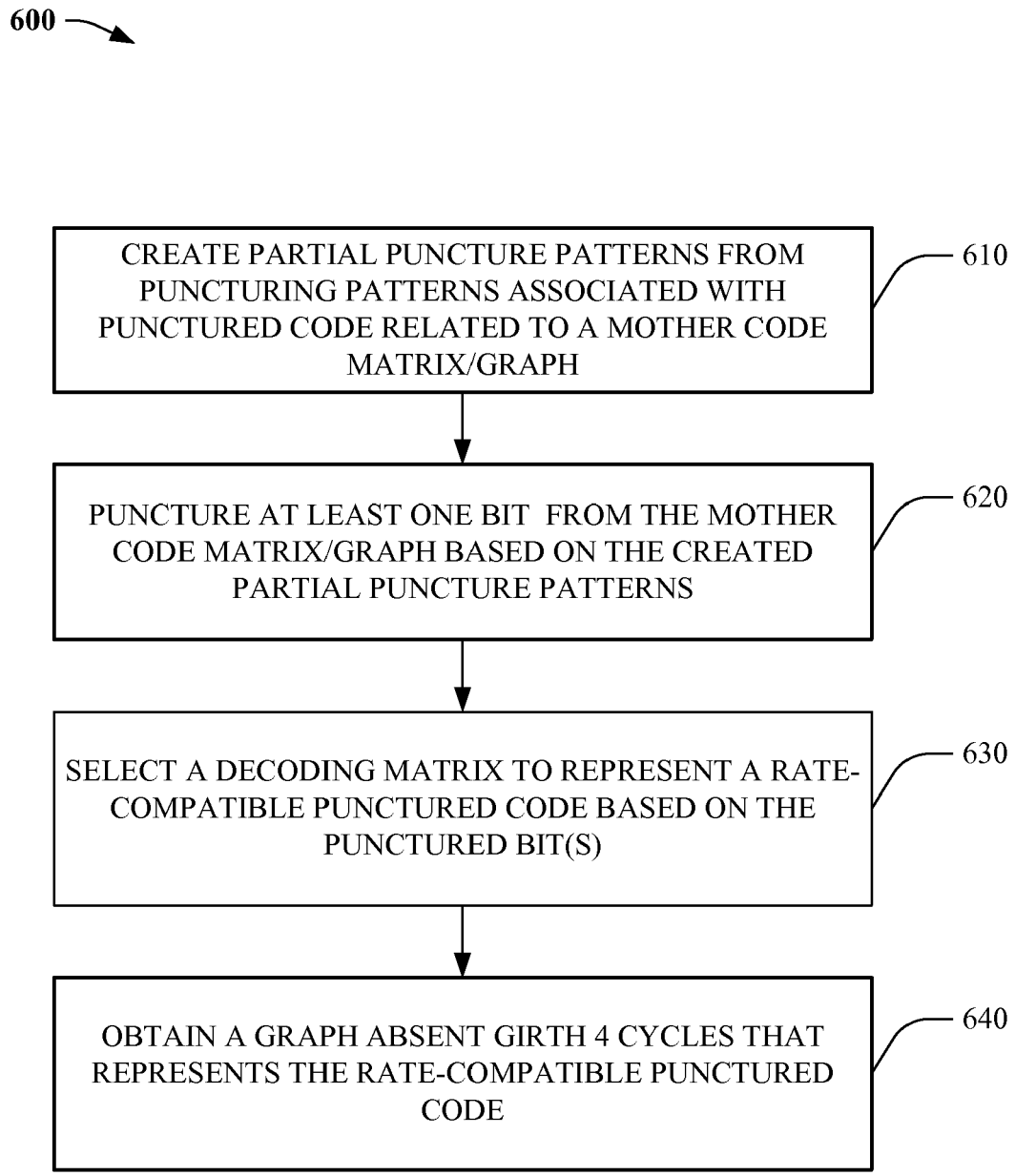
FIG. 6 illustrates a process for determining a matrix/graph representation of a rate-compatible punctured LDPC code, in accordance with an embodiment of the invention.

Referring now to FIG. 6, a process 600 for determining a matrix/graph representation of a rate-compatible punctured LDPC code is illustrated, in accordance with an embodiment of the invention. At 610, one or more puncturing patterns can be created from a puncturing pattern of a mother code matrix/graph. One or more bits of the mother code matrix/graph can be punctured, at 620, based on the one or more created puncturing patterns. At 630, a decoding matrix/graph can be selected to represent the rate-compatible punctured LDPC code based on the one or more punctured bits. In this way, rate-compatible LDPC code can be decoded faster and with lower computational complexity than conventional methods that use a mother code matrix/graph to iteratively decode rate-compatible codes. Further, a girth-4-free graph that represents the rate-compatible punctured LDPC code can be obtained at 640 to facilitate improved decoding performance.

Figure 7:
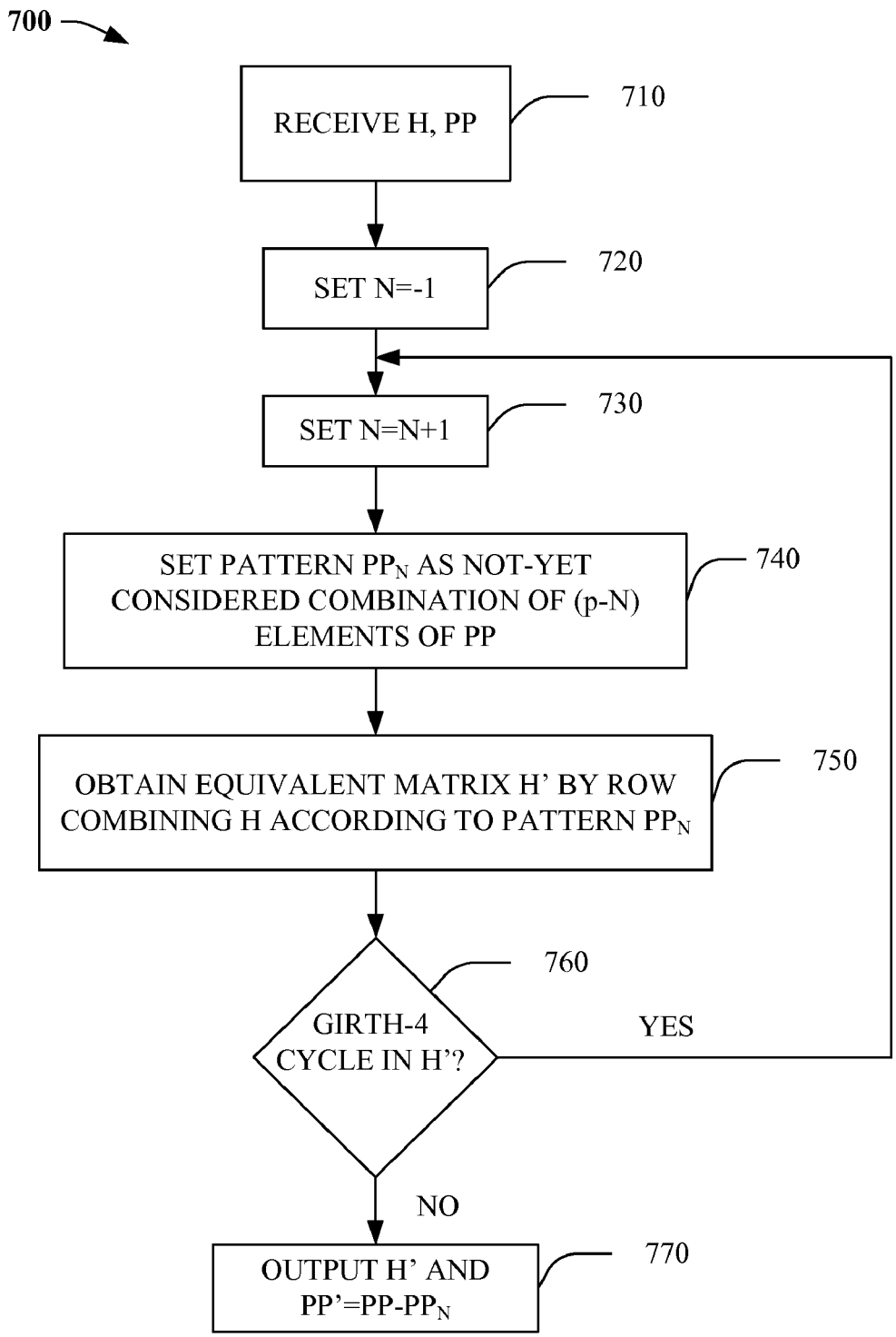
FIG. 7 illustrates another process for determining a matrix/graph representation of a rate-compatible punctured LDPC code, in accordance with an embodiment of the invention.

FIG. 7 illustrates another process (e.g., process 700) for determining a matrix/graph representation of a rate-compatible punctured LDPC code, in accordance with an embodiment of the invention. At 710, a mother code parity check matrix (H) and a puncturing pattern (PP) of the mother code parity check can be received. In the embodiment illustrated by FIG. 7, the parity check matrix represents LDPC mother code. However, in another embodiment (not illustrated), the parity check matrix can represent B-LDPC mother code associated with a block size z—accordingly, block size z can also be received at 710. At 720, loop variable N can be initialized to a value of −1. Loop variable N can be decremented by 1 at 730.

At 740, a puncture pattern ($PP_N$) can be determined based on a value of loop variable N and a not-yet considered combination of p—N elements of the puncturing pattern PP, in which p represents the size of the puncturing patter PP (or a number of puncturing positions included in puncturing pattern PP). Rows are combined in the mother code parity check matrix H (or parity bits punctured, as described above) at 750 to obtain an equivalent parity check matrix (H'), based on the determined puncture pattern $PP_N$. At 760, it can be determined whether the equivalent parity check matrix H' contains a girth-4 cycle. Flow of process 700 can continue to 730 if it is determined that the equivalent parity check matrix H' contains at least one girth-4 cycle. However, if it is determined that equivalent parity check matrix H' does not contain at least one girth-4 cycle, flow of process 700 can continue to 770, at which a smallest modified puncturing pattern PP' corresponding to the equivalent decoding matrix H' can be computed as PP'=PP−$PP_N$ for a targeted punctured code. Further, the equivalent parity check matrix H' and corresponding puncturing pattern PP' can be output at 770.

Figure 8:
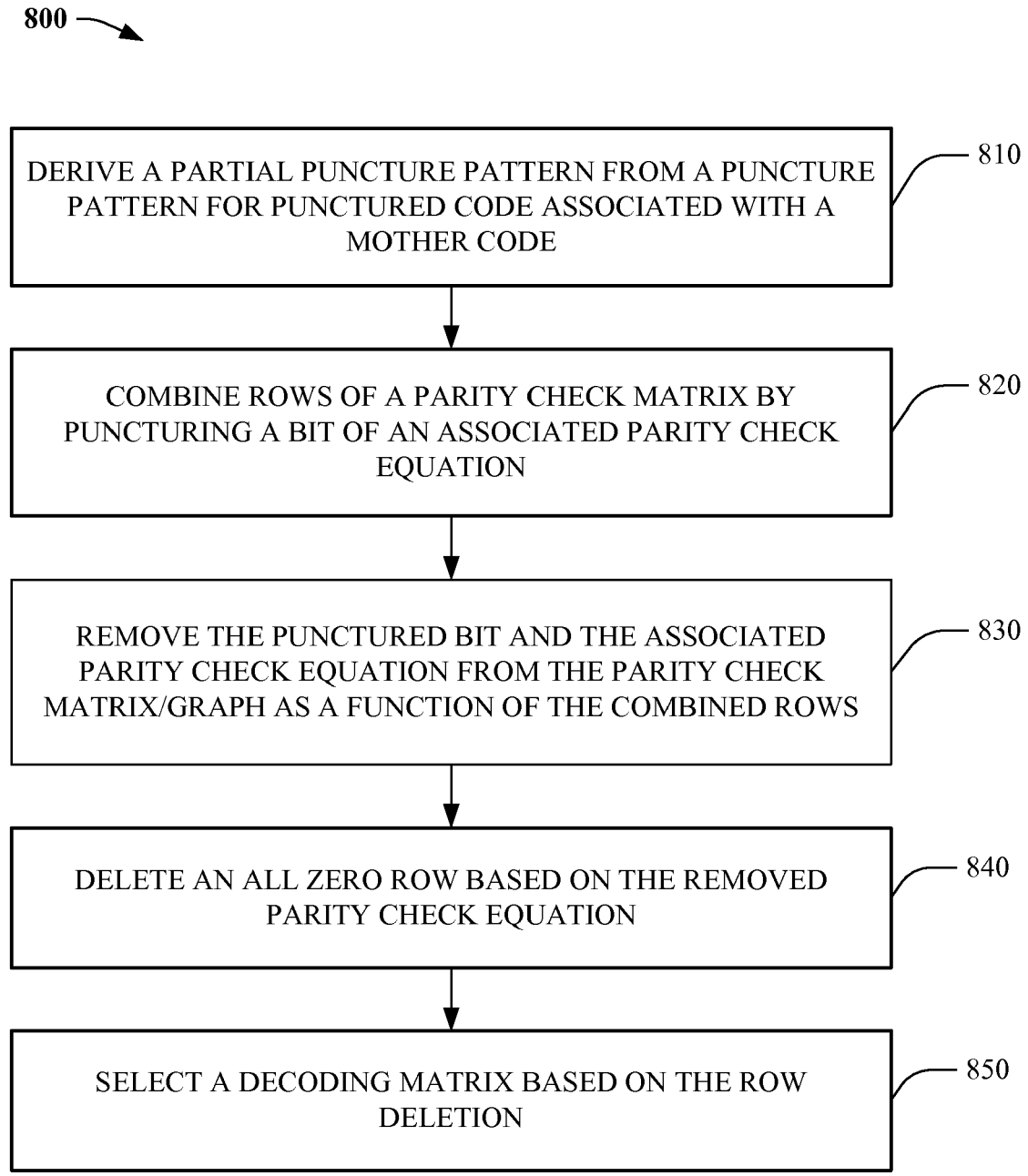
FIG. 8 illustrates yet another process for determining a matrix/graph representation of a rate-compatible punctured LDPC code, in accordance with an embodiment of the invention.

FIG. 8 illustrates yet another process (e.g., 800) for determining a matrix/graph representation of a rate-compatible punctured LDPC code, in accordance with an embodiment of the invention. A partial puncturing pattern for each puncture position of a rate-compatible punctured code can be derived at 810. Rowcombining of the parity check matrix of a code can be performed at 820 to find the equivalent decoding matrix after puncturing a bit from the code. The bit can be punctured by modulo-2 adding one parity check equation with itself and other parity check equations associated with the bit. At 830, the punctured bit and one associated parity check equation can be removed from the parity check matrix/graph based on the modulo-2 addition (or subtraction in the alternative). A row that contains all zeros as a result of the modulo-2 addition can be deleted at 840. At 850, a decoding matrix/graph can be selected to represent the rate-compatible punctured code based on the row deletion. This decoding matrix/graph can be used, instead of the parity check matrix/graph of the mother code, to obtain the rate-compatible punctured code more efficiently than conventional rate-compatible decoding techniques.

Figure 9:
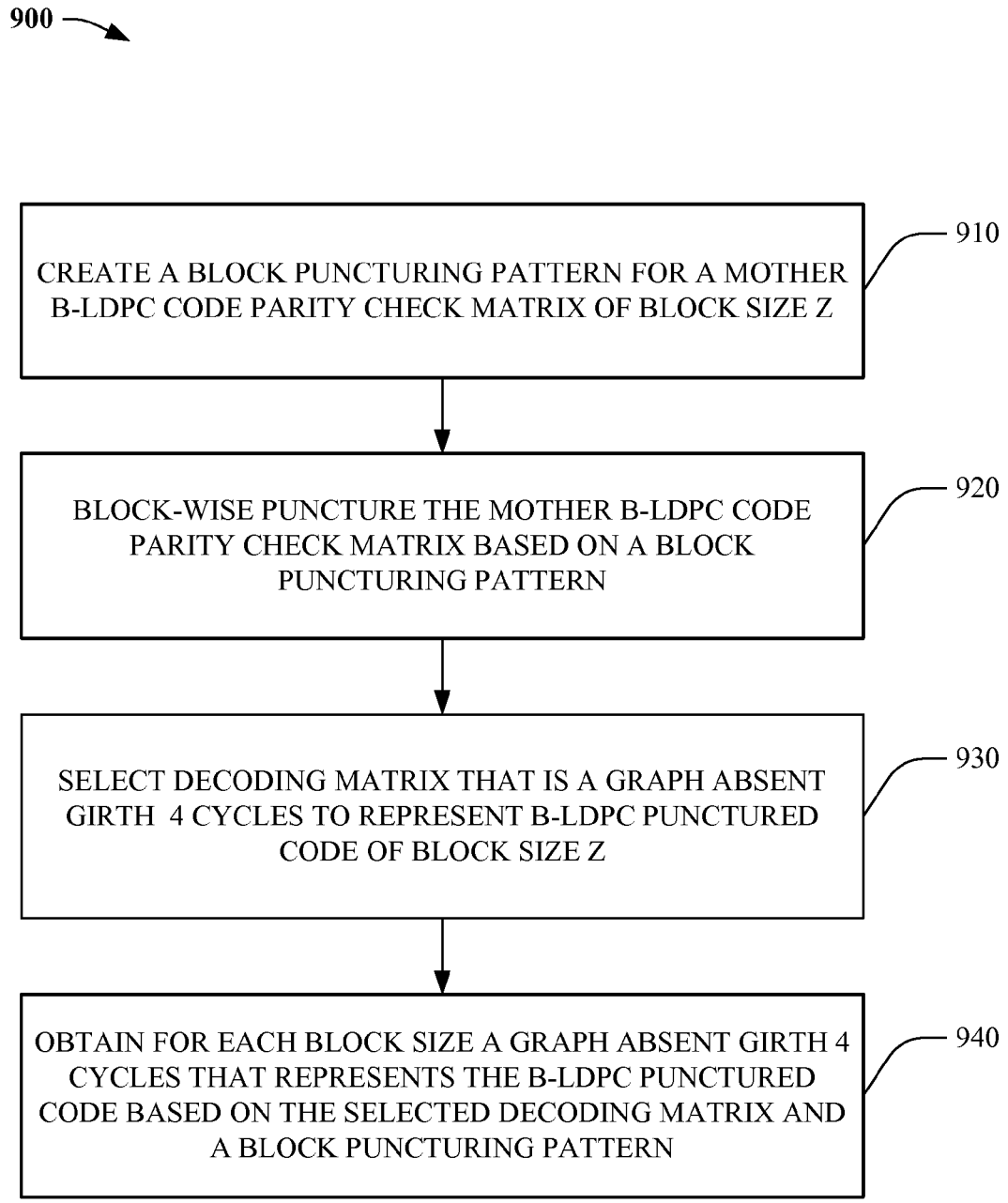
FIG. 9 illustrates a process for determining a matrix/graph representation of a rate-compatible punctured block-type LDPC (B-LDPC) code, in accordance with an embodiment of the invention.

FIG. 9 illustrates a process 900 for determining a matrix/graph representation of a rate-compatible punctured block-type LDPC (B-LDPC) code, in accordance with an embodiment of the invention. The following discussion provides context for aspects of an exemplary operation of process 900. A standardized B-LDPC code with a dual-diagonal structure (such as those specified in IEEE 802.16e) can relate to a parity check matrix H of dimension m.z by n.z, which can be viewed as an m by n array of z-dimensional square block matrices, each of which is either a circulant permutation matrix (denoted by a circular shift number) or an all-zero matrix (denoted by $-1$). Due to its block matrix structure, a parity check matrix of a B-LDPC code can be fully specified through a base matrix consisting of the circular shift numbers and $-1$. By specifying a range of values of z, multiple LDPC codes with the same code rate, but different code lengths, can be supported (i.e., B-LDPC code can support scalable code lengths). A base matrix can be constructed to ensure that a resultant parity check matrix with the smallest supported block size z has no cycles of small girth (i.e., girth>4).

Now referring to FIG. 9, a block puncturing pattern for a mother B-LDPC code parity check matrix with block size z can be created at 910. At 920, block-wise puncturing of the mother B-LDPC code parity check matrix can be performed as a function of a block-wise puncturing pattern. A decoding matrix that is a graph absent girth 4 cycles can be selected to represent an equivalent decoding matrix/graph of the B-LDPC punctured code of block size z at 930. At 940, a graph absent girth 4 cycles that represents the equivalent decoding matrix/graph of the B-LDPC punctured code can be obtained based on an associated selected decoding matrix/graph and block puncture pattern.

Figure 10:
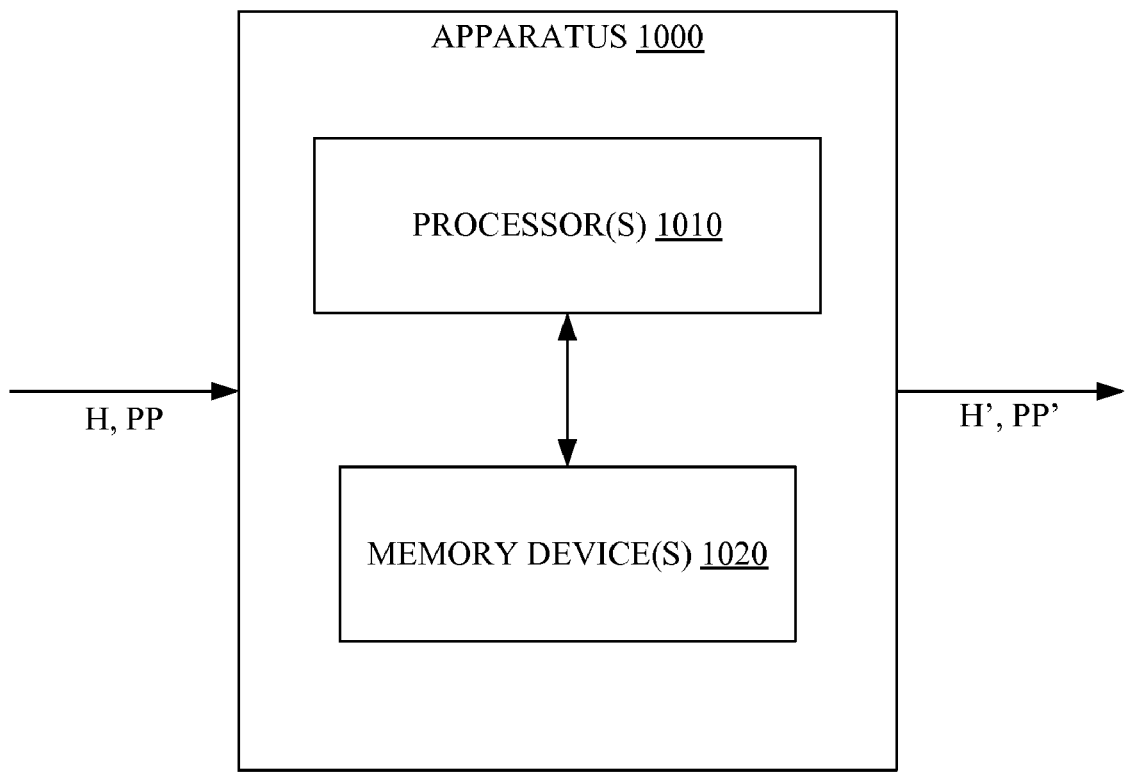
FIG. 10 illustrates a block diagram of an apparatus that creates a matrix/graph representation of a rate-compatible punctured LDPC code, in accordance with an embodiment of the invention.

FIG. 10 illustrates a block diagram of an apparatus 1000 that creates a matrix/graph representation of a rate-compatible punctured LDPC code, in accordance with an embodiment of the invention. Apparatus 1000, as illustrated by FIG. 10, can perform the acts described above, e.g., related to the discussion of FIGS. 1-3 and 7-8. For example, processor(s) 1010 can receive a parity check matrix (H) of a mother code and receive a puncture pattern (PP) of the parity check matrix. Processor(s) 1010 can store the parity check matrix and puncture pattern in memory device(s) 1020. In addition, processor(s) 1010 can determine a puncture pattern based on the received puncture pattern, and combine rows of the parity check matrix based on the determined puncture pattern (e.g., utilizing memory device(s) 1020). Further, processors(s) 1010, utilizing memory device(s) 1020, can select a decoding matrix and puncture pattern that represent the rate-compatible punctured LDPC code (e.g., as described in the discussion of FIG. 7 above).

Figure 11:
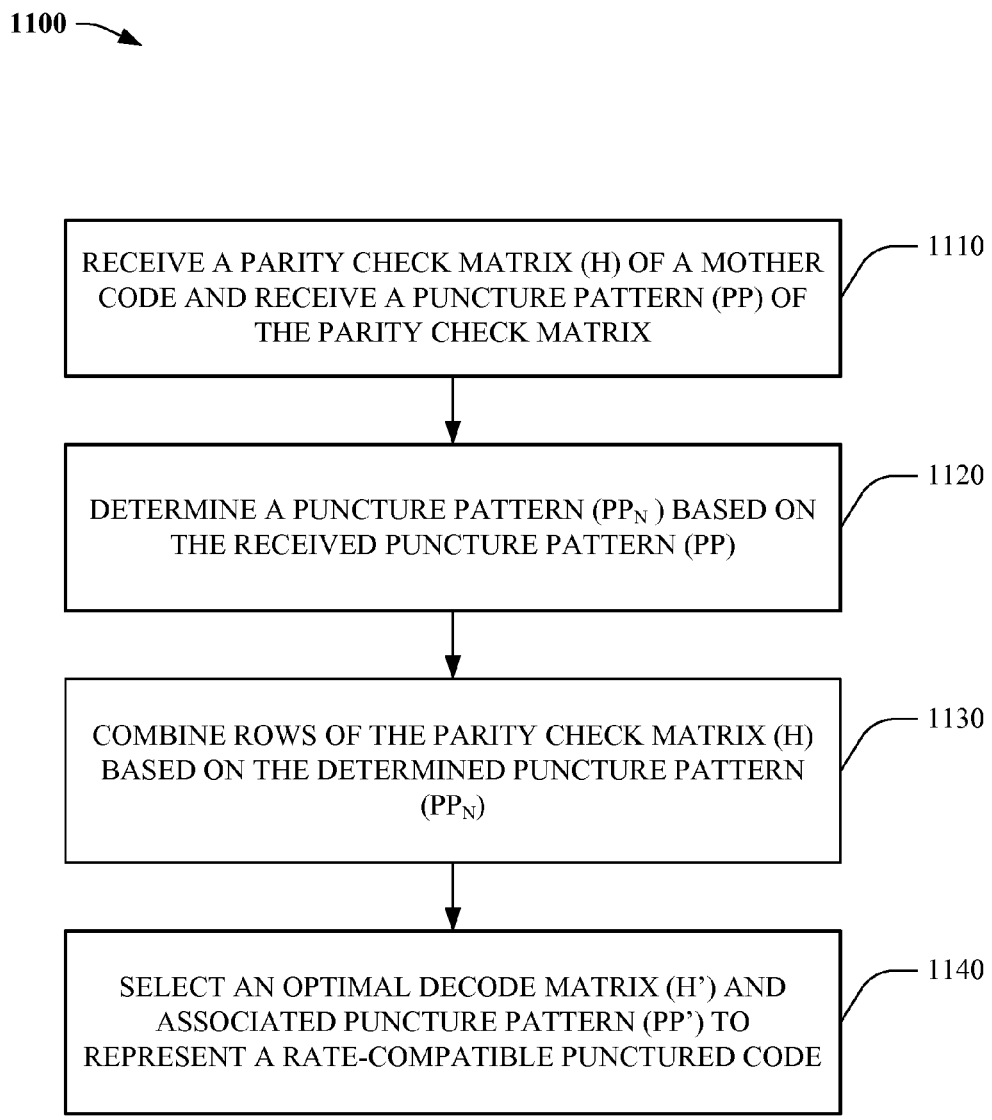
FIG. 11 illustrates a process performed by an apparatus that creates a matrix/graph representation of a rate-compatible punctured LDPC code, in accordance with an embodiment of the invention.

FIG. 11 illustrates a process 1100 performed by an apparatus (e.g., apparatus 1000 illustrated by FIG. 10) that creates a matrix/graph representation of a rate-compatible punctured LDPC code, in accordance with an embodiment of the invention. At 1110, a parity check matrix (H) of a mother code (e.g., LDPC code, B-LDPC code) and an associated puncture pattern (PP) can be received. A puncture pattern ($PP_N$) can be determined based on puncture pattern PP at 1120. At 1130, rows of parity check matrix (H) can be combined based on determined puncture pattern $PP_N$. A decoding matrix (H') and associated puncture pattern (PP') can be selected for representing a rate-compatible punctured code at 1140. In one embodiment, the decode matrix can be selected based on whether it includes a girth-4-free graph at a coding rate not larger than a current coding rate, and not smaller than the mother coding rate.

Figure 12:
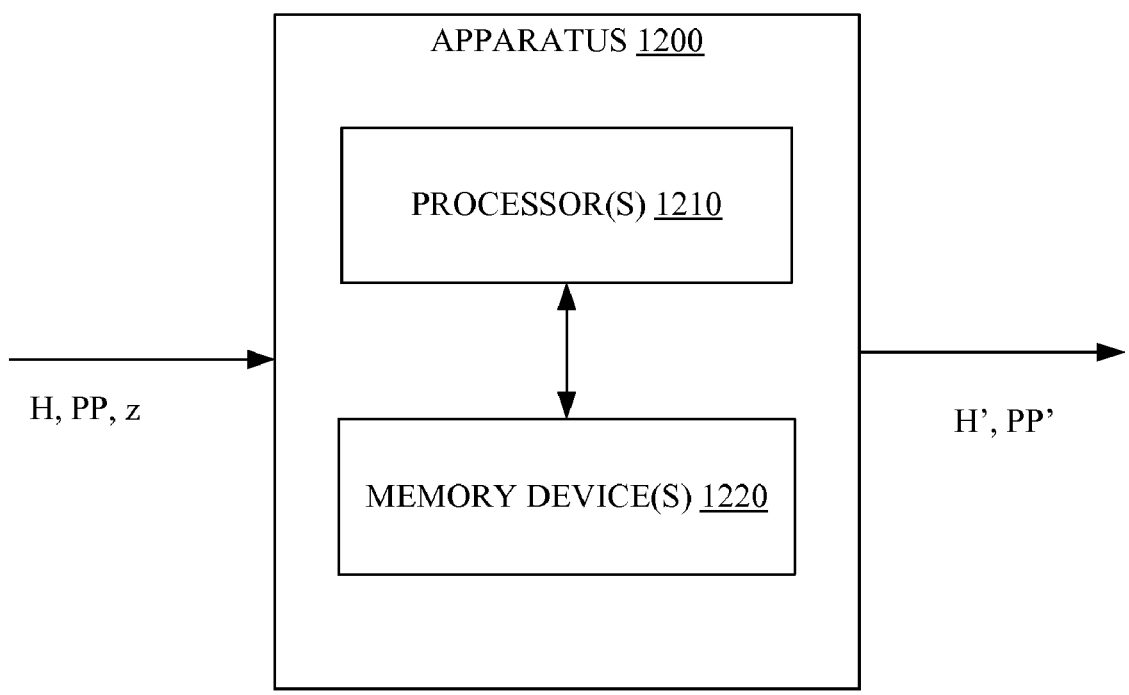
FIG. 12 illustrates a block diagram of an apparatus that creates a matrix/graph representation of a rate-compatible punctured B-LDPC code, in accordance with an embodiment of the invention.

FIG. 12 illustrates a block diagram of an apparatus 1200 that creates a matrix/graph representation of a rate-compatible punctured B-LDPC code, in accordance with an embodiment of the invention. Apparatus 1200, as illustrated by FIG. 12, can perform the acts described above, e.g., related to the discussion of FIG. 9. For example, processor(s) 1210 can receive a parity check matrix (H) of a mother B-LDPC code, a puncture pattern (PP) for the parity check matrix, and a block size (z) of the parity check matrix. Processor(s) 1210 can store the parity check matrix H, puncture pattern PP, and block size z in memory device(s) 1220. In addition, processor(s) 1210 can create a puncturing pattern for each block of the parity check matrix H based on the puncture pattern PP. Further, processor(s) 1210 can puncture each block of the parity check matrix H based on a block puncturing pattern created for the block (e.g., utilizing memory device(s) 1220). Moreover, processor(s) 1210, utilizing memory device(s) 1220, can select a decoding matrix/graph that is absent girth 4 cycles to represent B-LDPC punctured code of block size z. In addition, processor(s) 1210 can obtain a graph absent girth 4 cycles that represents each block of the B-LDPC punctured code, based on a selected decoding matrix and a puncturing pattern of an associated block.

Figure 13:
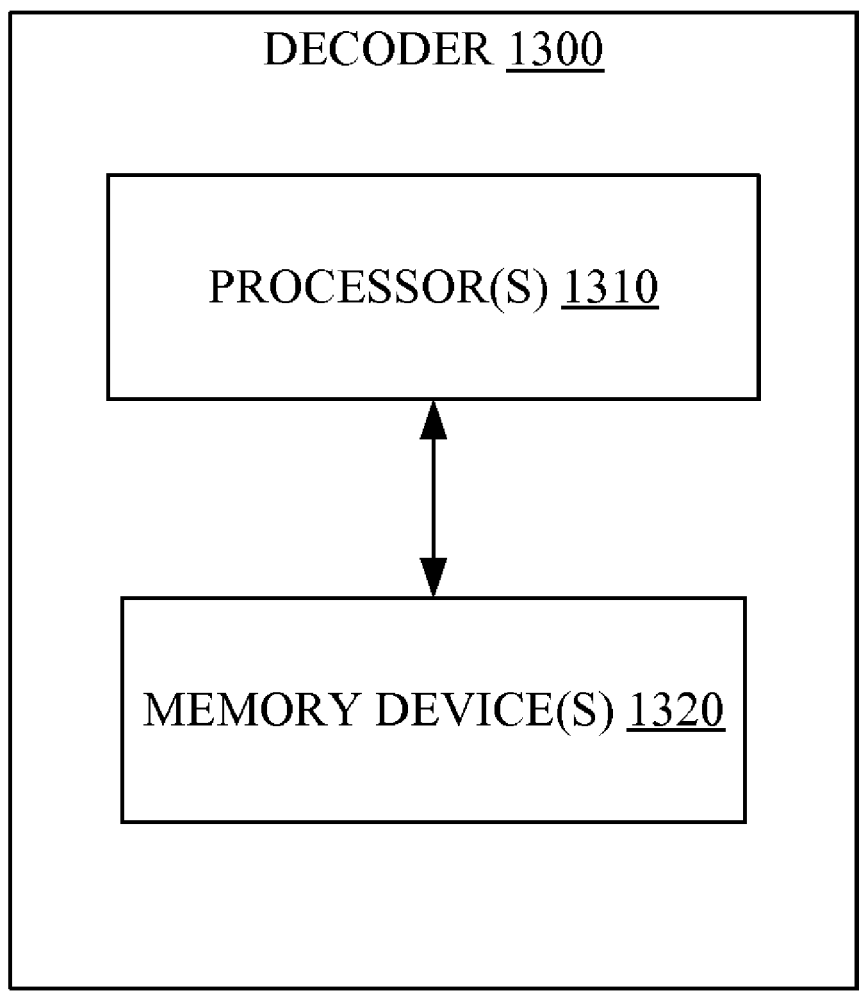
FIG. 13 illustrates a block diagram of a decoder that obtains an efficient decoding representation of a rate-compatible punctured LDPC code based on an equivalent decoding matrix/graph, in accordance with an embodiment of the invention.

FIG. 13 illustrates a block diagram of a decoder 1300 that decodes an equivalent decoding matrix/graph (e.g., a girth-4-free graph derived by apparatus 1200 illustrated by FIG. 12) to obtain rate-compatible punctured LDPC code, in accordance with an embodiment of the invention. For example, processor(s) 1310 can utilize memory device(s) 1320 to decode an equivalent decoding matrix/graph and obtain a rate-compatible punctured LDPC code as a function of a difference between a puncture pattern of a mother LDPC code graph and a puncture pattern created by pattern component 310 of system 300 (described above).

Figure 14:
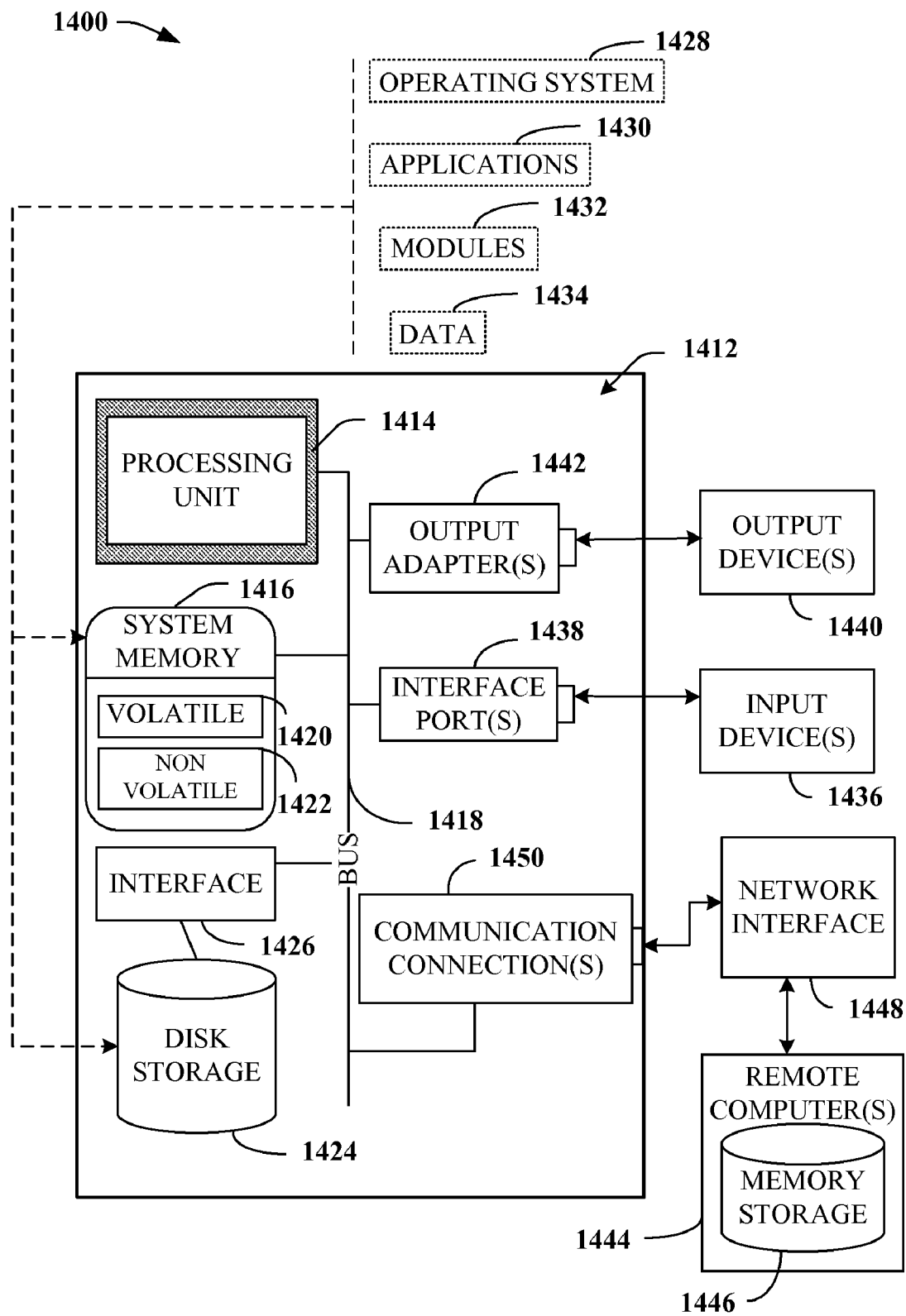
FIG. 14 illustrates a block diagram of a computer operable to execute the disclosed methods and apparatus, in accordance with an embodiment of the invention.
Figure 15:
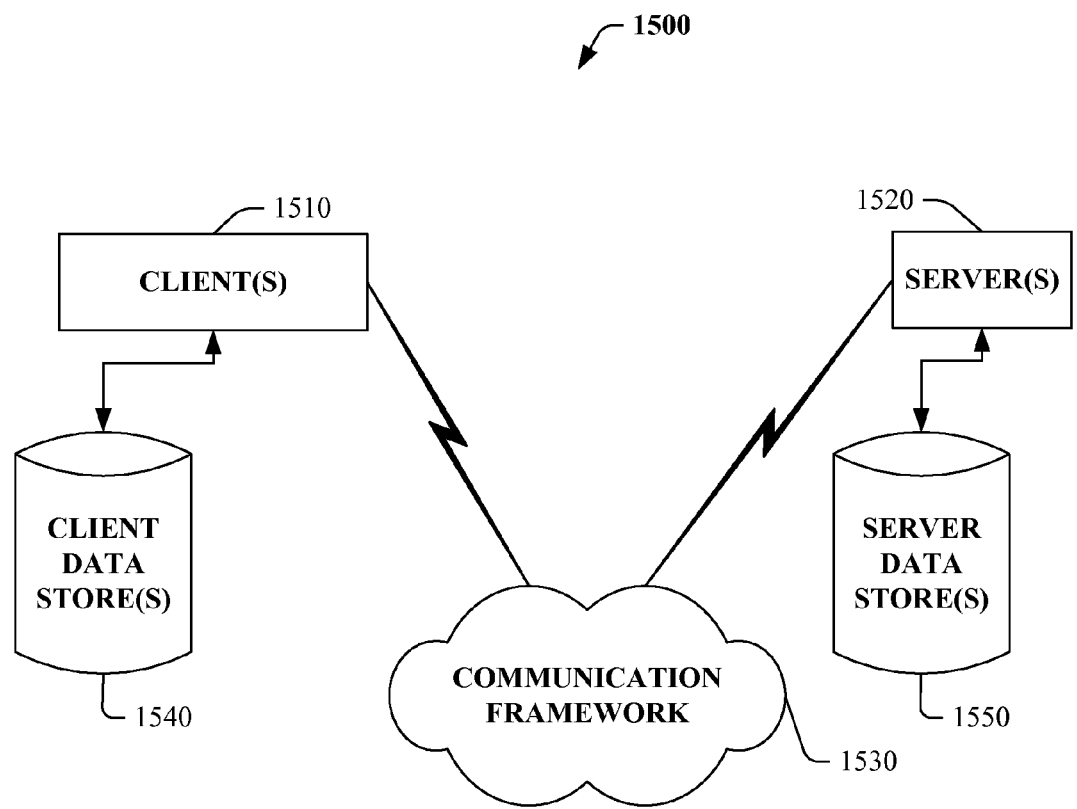
FIG. 15 illustrates a schematic block diagram of an exemplary computing environment, in accordance with an embodiment of the invention.

In order to provide a context for the various aspects of the disclosed subject matter, FIGS. 14 and 15, as well as the following discussion, are intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that the subject innovation also may be implemented in combination with other program modules. Generally, program modules include routines, programs, components, data structures, etc. that perform particular tasks and/or implement particular abstract data types.

Moreover, those skilled in the art will appreciate that the inventive systems may be practiced with other computer system configurations, including single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone computers. In a distributed computing environment, program modules may be located in both local and remote memory storage devices.

With reference to FIG. 14, a block diagram of a computer 1400 operable to execute the disclosed systems and methods, in accordance with an embodiment of the invention, includes a computer 1412. The computer 1412 includes a processing unit 1414, a system memory 1416, and a system bus 1418. The system bus 1418 couples system components including, but not limited to, the system memory 1416 to the processing unit 1414. The processing unit 1414 can be any of various available processors. Dual microprocessors and other multiprocessor architectures also can be employed as the processing unit 1414.

The system bus 1418 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1194), and Small Computer Systems Interface (SCSI).

The system memory 1416 includes volatile memory 1420 and nonvolatile memory 1422. The basic input/output system (BIOS), containing the basic routines to transfer information between elements within the computer 1412, such as during start-up, is stored in nonvolatile memory 1422. By way of illustration, and not limitation, nonvolatile memory 1422 can include ROM, PROM, EPROM, EEPROM, or flash memory. Volatile memory 1420 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1412 also includes removable/non-removable, volatile/nonvolatile computer storage media. FIG. 14 illustrates, for example, disk storage 1424. Disk storage 1424 includes, but is not limited to, devices like a magnetic disk drive, floppy disk drive, tape drive, Jaz drive, Zip drive, LS-100 drive, flash memory card, or memory stick. In addition, disk storage 1424 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1424 to the system bus 1418, a removable or non-removable interface is typically used, such as interface 1426.

It is to be appreciated that FIG. 14 describes software that acts as an intermediary between users and the basic computer resources described in the suitable operating environment 1400. Such software includes an operating system 1428. Operating system 1428, which can be stored on disk storage 1424, acts to control and allocate resources of the computer system 1412. System applications 1430 take advantage of the management of resources by operating system 1428 through program modules 1432 and program data 1434 stored either in system memory 1416 or on disk storage 1424. It is to be appreciated that the disclosed subject matter can be implemented with various operating systems or combinations of operating systems.

A user enters commands or information into the computer 1411 through input device(s) 1436. Input devices 1436 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1414 through the system bus 1418 via interface port(s) 1438. Interface port(s) 1438 include, for example, a serial port, a parallel port, a game port, and a universal serial bus (USB). Output device(s) 1440 use some of the same type of ports as input device(s) 1436.

Thus, for example, a USB port may be used to provide input to computer 1412, and to output information from computer 1412 to an output device 1440. Output adapter 1442 is provided to illustrate that there are some output devices 1440 like monitors, speakers, and printers, among other output devices 1440, which require special adapters. The output adapters 1442 include, by way of illustration and not limitation, video and sound cards that provide a means of connection between the output device 1440 and the system bus 1418. It should be noted that other devices and/or systems of devices provide both input and output capabilities such as remote computer(s) 1444.

Computer 1412 can operate in a networked environment using logical connections to one or more remote computers, such as remote computer(s) 1444. The remote computer(s) 1444 can be a personal computer, a server, a router, a network PC, a workstation, a microprocessor based appliance, a peer device or other common network node and the like, and typically includes many or all of the elements described relative to computer 1412.

For purposes of brevity, only a memory storage device 1446 is illustrated with remote computer(s) 1444. Remote computer(s) 1444 is logically connected to computer 1412 through a network interface 1448 and then physically connected via communication connection 1450. Network interface 1448 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1450 refer(s) to the hardware/software employed to connect the network interface 1448 to the bus 1418. While communication connection 1450 is shown for illustrative clarity inside computer 1412, it can also be external to computer 1412. The hardware/software necessary for connection to the network interface 1448 includes, for exemplary purposes only, internal and external technologies such as, modems including regular telephone grade modems, cable modems and DSL modems, ISDN adapters, and Ethernet cards.

FIG. 15 illustrates a schematic block diagram of an exemplary computing environment 1530, in accordance with an embodiment of the invention. The system 1500 includes one or more client(s) 1510. The client(s) 1510 can be hardware and/or software (e.g., threads, processes, computing devices). The system 1500 also includes one or more server(s) 1520. Thus, system 1500 can correspond to a two-tier client server model or a multi-tier model (e.g., client, middle tier server, data server), amongst other models. The server(s) 1520 can also be hardware and/or software (e.g., threads, processes, computing devices). The servers 1520 can house threads to perform transformations by employing the subject innovation, for example. One possible communication between a client 1510 and a server 1520 may be in the form of a data packet transmitted between two or more computer processes.

The system 1500 includes a communication framework 1530 that can be employed to facilitate communications between the client(s) 1510 and the server(s) 1520. The client(s) 1510 are operatively connected to one or more client data store(s) 1540 that can be employed to store information local to the client(s) 1510. Similarly, the server(s) 1520 are operatively connected to one or more server data store(s) 1550 that can be employed to store information local to the servers 1520.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art should recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A system comprising:
   at least one processor that executes the following computer executable components:
   a puncturing component that derives one or more partial puncturing patterns from a parity check matrix/graph of a mother code and a puncturing pattern related to a target rate of a rate compatible punctured code;
   a rowcombining component that:
   combines rows of the parity check matrix/graph based on the derived one or more partial puncturing patterns; and
   creates at least one decoding matrix/graph that represents the rate-compatible punctured code based on the combined rows; and
   a selection component that selects a decoding matrix/graph from the created at least one decoding matrix/graph that does not include a girth-4 cycle.

2. The system of claim 1, further comprising:
   a pattern component that creates a puncturing pattern for decoding the rate-compatible punctured code using the selected decoding matrix/graph.

3. The system of claim 2, further comprising:
   a graph component that derives a girth-4-free decoding matrix/graph that corresponds to the rate-compatible punctured code based on, at least in part, the selected decoding matrix/graph and the created puncturing pattern.

4. The system of claim 3, further comprising:
   a decode component that decodes the rate-compatible punctured code based on, at least in part, a difference between the puncturing pattern specified for the mother code and the derived one or more partial puncturing patterns.

5. The system of claim 1, wherein the rowcombining component combines the rows by:
   puncturing a bit from at least one parity check equation by modulo-2 adding one parity check matrix/graph with the one parity check matrix/graph and other parity check equations associated with the bit; and
   removing the punctured bit and one associated parity check equation from the parity check matrix/graph based on the modulo-2 adding.

6. The system of claim 5, wherein the selection component selects the decoding matrix by:
   deleting an all zero row based on the removing; and
   selecting a decoding matrix to represent rate-compatible punctured code as a function of the deleting.

7. A method comprising:
   employing at least one processor to execute computer executable instructions stored on at least one computer readable medium to perform the following acts:
   creating a partial puncturing pattern based on a puncturing pattern of a matrix of a mother code;
   puncturing one or more bits from the mother code matrix based on the created partial puncturing pattern;
   selecting a decoding matrix based on the puncturing; and
   obtaining a graph without girth 4 cycles that represents rate-compatible punctured code based on, at least in part, the selected decoding matrix and the created puncturing pattern.

8. The method of claim 7, further comprising:
   determining a modified puncturing pattern based on a difference between the puncturing pattern specified for the matrix of the mother code and the created partial puncturing pattern; and
   decoding the rate-compatible punctured code with the selected decoding matrix based on the modified puncturing pattern.

9. The method of claim 8, wherein the rate-compatible punctured code comprises a punctured Low-density Parity-check (LDPC) code.

10. The method of claim 8, wherein the rate-compatible punctured code comprises a punctured Block-type Low-density Parity-check (B-LDPC) code.

11. The method of claim 10, wherein the creating comprises:
    creating a modified block puncturing pattern associated with a selected decoding matrix for decoding the rate-compatible punctured code based on a puncturing pattern associated with a base matrix of the mother code.

12. The method of claim 11, wherein the puncturing comprises:
    puncturing each block matrix based on an associated block puncturing pattern.

13. The method of claim 12, wherein the selecting comprises:
    selecting a decoding matrix for each block based on the puncturing.

14. The method of claim 13, wherein the obtaining comprises:
    obtaining a graph without girth 4 cycles that represents the rate-compatible punctured code based on, at least in part, an associated selected decoding matrix and created modified block puncturing pattern.

15. The method of claim 8, wherein the decoding comprises:
decoding punctured Block-type Low-density Parity-check (B-LDPC) code based on a girth-4-free graph that represents the punctured B-LDPC code;
wherein the girth-4-free graph is derived from an associated B-LDPC mother code based on a selected derived partial puncturing pattern.

16. The method of claim 7, wherein the puncturing comprises:
removing one or more variable nodes from the matrix of the mother code.

17. The method of claim 16, wherein the removing comprises:
combining one or more parity check equations of the mother code matrix by eliminating a punctured parity variable related to checksums of the one or more parity check equations.

18. An apparatus comprising:
at least one processor;
at least one memory device coupled to the at least one processor, wherein the at least one processor accesses data and instructions stored in the at least one memory device, and wherein the at least one memory device comprises instructions for:
receiving a parity check matrix of a mother code;
receiving a puncture pattern of the parity check matrix;
determining partial puncture patterns based on the received puncture pattern and the mother code graph/matrix;
combining rows of the parity check matrix based on the determined partial puncture patterns; and
selecting a decode matrix and puncture pattern that represents rate-compatible punctured code based on, at least in part, the combining, the determining, and the puncture pattern of the mother code.

19. The apparatus of claim 18, wherein the at least one memory device further comprises instructions for:
deriving a modified puncturing pattern based on the determined partial puncture patterns; and
determining a girth-4-free graph that represents the rate-compatible punctured code based on the selected decode matrix and the modified puncturing pattern.

20. The apparatus of claim 18, wherein the combining comprises:
puncturing a bit associated with check equations of the parity check matrix; and
removing a check equation based on the punctured bit.

21. The apparatus of claim 18, wherein the determining comprises:
determining a block puncturing pattern for each block of a punctured Block-type Low-density Parity-check (B-LDPC) code based on, at least in part, a puncture pattern of a base matrix of the mother code.

22. The apparatus of claim 21, wherein the combining comprises:
puncturing each block based on puncture subsets of a puncturing pattern of the block; and
combining block rows related to the punctured block.

23. The apparatus of claim 22, wherein the selecting comprises:
selecting a decode matrix and puncture pattern for each block size of the punctured B-LDPC code as a function of the determining, the puncturing, and the combining.

24. The apparatus of claim 23, wherein the determining comprises:
determining a girth-4-free graph that represents each block based on the selected decode matrix and the selected puncture pattern associated with the block size.

25. A decoder comprising:
at least one processor;
at least one memory device coupled to the at least one processor, wherein the at least one processor accesses data and instructions stored in the at least one memory device, and wherein the at least one memory device comprises instructions for:
decoding on a girth-4-free graph using a modified puncturing pattern that represents a rate-compatible punctured code;
deriving a partial puncturing pattern for a target rate of the rate-compatible punctured code; and
obtaining the rate-compatible punctured code based on the modified puncturing pattern, wherein the modified puncturing pattern is determined by the difference between a puncturing pattern of a mother code graph and the derived partial puncturing pattern.

* * * * *

UNITED STATES PATENT AND TRADEMARK OFFICE
CERTIFICATE OF CORRECTION

| | | |
|---|---|---|
| PATENT NO. | : 8,245,097 B2 | Page 1 of 1 |
| APPLICATION NO. | : 12/430604 | |
| DATED | : August 14, 2012 | |
| INVENTOR(S) | : Mow et al. | |

It is certified that error appears in the above-identified patent and that said Letters Patent is hereby corrected as shown below:

On the Title Page, in Field (56), under "OTHER PUBLICATIONS", in Column 2, Line 3, delete "D.J.C.MacKay." and insert -- D. J. C. MacKay, --, therefor.

In Column 8, Line 58, delete "PP'corresponding" and insert -- PP' corresponding --, therefor.

In Column 11, Line 46, delete "Synchlink" and insert -- Synclink --, therefor.

Signed and Sealed this
Eighth Day of January, 2013

David J. Kappos
*Director of the United States Patent and Trademark Office*